(12) United States Patent
Kataoka et al.

(10) Patent No.: US 11,373,040 B2
(45) Date of Patent: Jun. 28, 2022

(54) COMPUTER-READABLE RECORDING MEDIUM, ENCODING DEVICE, INDEX GENERATING DEVICE, SEARCH DEVICE, ENCODING METHOD, INDEX GENERATING METHOD, AND SEARCH METHOD

(71) Applicant: FUJITSU LIMITED, Kawasaki (JP)

(72) Inventors: Masahiro Kataoka, Kamakura (JP); Yoshikazu Kawakubo, Machida (JP); Shouji Iwamoto, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 333 days.

(21) Appl. No.: 15/980,231

(22) Filed: May 15, 2018

(65) Prior Publication Data

US 2018/0336178 A1      Nov. 22, 2018

(30) Foreign Application Priority Data

May 16, 2017   (JP) .............................. JP2017-097668

(51) Int. Cl.
| | |
|---|---|
| G06F 16/00 | (2019.01) |
| G06F 40/242 | (2020.01) |
| G06F 16/242 | (2019.01) |
| G06F 16/2455 | (2019.01) |
| H03M 7/30 | (2006.01) |
| G06F 16/31 | (2019.01) |

(52) U.S. Cl.
CPC .......... G06F 40/242 (2020.01); G06F 16/243 (2019.01); G06F 16/2455 (2019.01); G06F 16/313 (2019.01); H03M 7/3088 (2013.01)

(58) Field of Classification Search
CPC ............. G06F 2212/401; G06F 40/242; G06F 16/243; G06F 16/313; G06F 16/2455; H03M 7/3088
See application file for complete search history.

(56) References Cited

U.S. PATENT DOCUMENTS

| | | |
|---|---|---|
| 5,138,669 A | 8/1992 | Shimura et al. |
| 5,140,644 A | 8/1992 | Kawaguchi et al. |
| 5,168,533 A | 12/1992 | Kato et al. |
| 5,220,625 A | 6/1993 | Hatakeyama et al. |

(Continued)

FOREIGN PATENT DOCUMENTS

| | | |
|---|---|---|
| EP | 2 978 134 A1 | 1/2016 |
| EP | 3 032 439 A1 | 6/2016 |

(Continued)

OTHER PUBLICATIONS

Extended European Search Report dated Oct. 1, 2018 in Patent Application No. 18172311.5, 7 pages.

(Continued)

*Primary Examiner* — Hung Q Pham
(74) *Attorney, Agent, or Firm* — Xsensus LLP

(57) ABSTRACT

An information processing device executes a process includes determining whether or not encoding target data is in an inflective form of a word when the encoding target data included in target sentence data is encoded; and registering the encoding target data and a code assigned to the encoding target data in a dynamic dictionary in association with each other, in a case where the encoding target data is in the inflective form of the word.

4 Claims, 15 Drawing Sheets

(56) References Cited

U.S. PATENT DOCUMENTS

| | | |
|---|---|---|
| 5,454,105 A | 9/1995 | Hatakeyama et al. |
| 5,469,354 A | 11/1995 | Hatakeyama et al. |
| 5,471,610 A | 11/1995 | Kawaguchi et al. |
| 5,519,857 A | 5/1996 | Kato et al. |
| 5,748,953 A | 5/1998 | Mizutani et al. |
| 5,757,983 A | 5/1998 | Kawaguchi et al. |
| 6,094,647 A | 7/2000 | Kato et al. |
| 2009/0193020 A1 | 7/2009 | Kataoka et al. |
| 2012/0072434 A1 | 3/2012 | Kataoka et al. |
| 2013/0181851 A1 | 7/2013 | Kataoka |
| 2016/0006456 A1 | 1/2016 | Muramatsu et al. |
| 2016/0171031 A1* | 6/2016 | Kataoka ................ G06F 16/313 707/741 |
| 2018/0129678 A1 | 5/2018 | Kataoka et al. |

FOREIGN PATENT DOCUMENTS

| | | |
|---|---|---|
| JP | 5-174064 | 7/1993 |
| JP | 2003-281171 | 10/2003 |
| JP | 2013-150041 | 8/2013 |
| WO | WO 2008/047432 A1 | 4/2008 |
| WO | 2014/147672 A1 | 9/2014 |
| WO | 2017/009958 A1 | 1/2017 |

OTHER PUBLICATIONS

JP Office Action dated Jan. 5, 2021 for the corresponding Japanese patent application No. 2017-097668.

\* cited by examiner

FIG.4

| BIT FILTER | | | | STATIC DICTIONARY | | | |
|---|---|---|---|---|---|---|---|
| 2 GRAMS | BIT MAP | POINTER WITH RESPECT TO EACH WORD | WORD | STRING LENGTH | APPEARANCE FREQUENCY | CODE LENGTH | BASIC CODE | DYNAMIC CODE |
| aa | 0_0_0_0_0 | | a | 0 | 9738 | 8 | 25h | |
| ab | 1_0_0_0_0 | | ... | ... | ... | ... | ... | |
| ac | 1_0_0_0_0 | | able | 4 | 785 | 16 | 6005h | |
| : | 0_1_0_0_0 | | ... | ... | ... | ... | ... | |
| : | ... | | abject | 6 | 17 | 16 | 6008h | |
| aΔ | | | ... | ... | ... | ... | ... | |
| bl | 0_1_0_0_0 | | about | 5 | 539 | 16 | 6028h | |
| bo | 0_1_0_0_0 | | above | 5 | - | 16 | 602Eh | |
| ct | 0_1_0_0_0 | | ... | ... | ... | ... | ... | |
| | | | act | 3 | - | 16 | 6041h | |
| | | | acted | 5 | ... | ... | 6041h | |
| | | | acting | 6 | ... | ... | 6041h | |
| eΔ | 0_0_0_1_1 | | as | 2 | 4832 | 8 | 32h | |
| le | 0_0_1_0_0 | | ... | ... | ... | ... | ... | |
| | | | eat | 3 | - | 16 | 60F5h | |
| tΔ | 0_0_1_0_0 | | eating | 6 | ... | ... | 60F5h | |
| | | | ... | ... | ... | ... | ... | |

| DYNAMIC CODE | BASIC CODE | CHANGE TYPE | (WORD) |
|---|---|---|---|
| A100h | 6041h | PAST FORM | (acted) |
| | 6041h | PROGRESSIVE FORM | (acting) |
| | 6041h | THIRD-PERSON SINGULAR | (acts) |
| | ... | ... | |
| | 60F5h | PAST FORM | (ate) |
| | 60F5h | PAST PARTICIPLE FORM | (eaten) |
| A101h | 60F5h | PROGRESSIVE FORM | (eating) |
| | 60F5h | THIRD-PERSON SINGULAR | (eats) |
| | ... | ... | |
| | ... | ... | |

| 2 GRAMS | BIT MAP | POINTER WITH RESPECT TO EACH WORD | WORD | STRING LENGTH | APPEARANCE FREQUENCY | CODE LENGTH | BASIC CODE | DYNAMIC CODE |
|---|---|---|---|---|---|---|---|---|
| aa | 0_0_0_0_0 | | a | 0 | 9738 | 8 | 25h | |
| ab | 1_0_0_0_0 | | ... | ... | ... | ... | ... | |
| ac | 1_0_0_0_0 | | able | 4 | 785 | 16 | 6005h | |
| : | 0_1_0_0_0 | | ... | ... | ... | ... | ... | |
| ... | ... | | abject | 6 | 17 | 16 | 6008h | |
| aΔ | | | ... | ... | ... | ... | ... | |
| bl | 0_1_0_0_0 | | about | 5 | 539 | 16 | 6028h | |
| bo | 0_1_0_0_0 | | above | 5 | - | 16 | 602Eh | |
| ct | 0_1_0_0_0 | | ... | ... | ... | ... | ... | |
| | | | act | 3 | - | 16 | 6041h | A100h (PAST FORM) |
| | | | acted | 5 | - | 16 | 6041h | |
| | | | acting | 6 | - | 16 | 6041h | |
| eΔ | 0_0_0_1_1 | | ... | ... | ... | ... | ... | |
| le | 0_0_1_0_0 | | as | 2 | 4832 | 8 | 32h | |
| | | | eat | 3 | - | ... | 60F5h | |
| tΔ | 0_0_1_0_0 | | eating | 6 | - | 16 | 60F5h | A101h (PROGRESSIVE FORM) |
| | | | ... | ... | ... | ... | ... | |

BIT FILTER / STATIC DICTIONARY — 121

COMPUTER-READABLE RECORDING MEDIUM, ENCODING DEVICE, INDEX GENERATING DEVICE, SEARCH DEVICE, ENCODING METHOD, INDEX GENERATING METHOD, AND SEARCH METHOD

CROSS-REFERENCE TO RELATED APPLICATION

This application is based upon and claims the benefit of priority of the prior Japanese Patent Application No. 2017-097668, filed on May 16, 2017, the entire contents of which are incorporated herein by reference.

FIELD

The embodiments discussed herein are related to an encoding program, an index generating program, a search program, and the like.

BACKGROUND

A technology has been known in which a word is extracted from a text file of a compressed target, and the extracted word is compressed in alphabet unit. In such a technology, a code is assigned to each alphabet of a to z, each of the alphabets included in the word extracted from the text file of the compressed target is converted into the code. Further, for example, code indicating information relevant to designation of full-width or half-width, designation of an upper case letter or a lower case letter, and the like is added to the converted code, and thus, the word is converted into the code. Further, recently, a technology has been proposed in which an individual code is assigned to a word having a high appearance frequency, and the word having a high appearance frequency, which is extracted from a text file of a compressed target, is directly converted into a code.

Patent Document 1: International Publication Pamphlet No. WO 2008/047432
Patent Document 2: Japanese Laid-open Patent Publication No. 2013-150041
Patent Document 3: Japanese Laid-open Patent Publication No. 05-174064

SUMMARY

According to an aspect of the embodiments, an encoding method includes determining whether or not encoding target data is in an inflective form of a word when encoding target data included in target sentence data is encoded, using a processor; and registering the encoding target data and a code assigned to the encoding target data in a dynamic dictionary in association with each other, in a case in which the encoding target data is in the inflective form of the word, using the processor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating a first example of a bit filter;

FIG. 5 is a diagram illustrating an example of a dynamic dictionary;

FIG. 6 is a diagram illustrating a second example of the bit filter;

DESCRIPTION OF EMBODIMENTS

However, in the technologies described above, the individual code is assigned to not only a basic form (for example, a present form) of the word having a high appearance frequency but also an inflective form such as a past form, a past participle form, and a plural form, and in a case where such a code and the inflective form of the word are registered in a static dictionary in association with each other, capacity demanded for the static dictionary increases, and thus, there is a case where a compression ratio decreases.

Preferred embodiments will be explained with reference to accompanying drawings. Furthermore, the range of right is not limited to such examples. The respective examples can be suitably combined within a range where processing contents do not contradict each other.

[a] First Embodiment

Encoding Processing of First Embodiment

Figure 1:
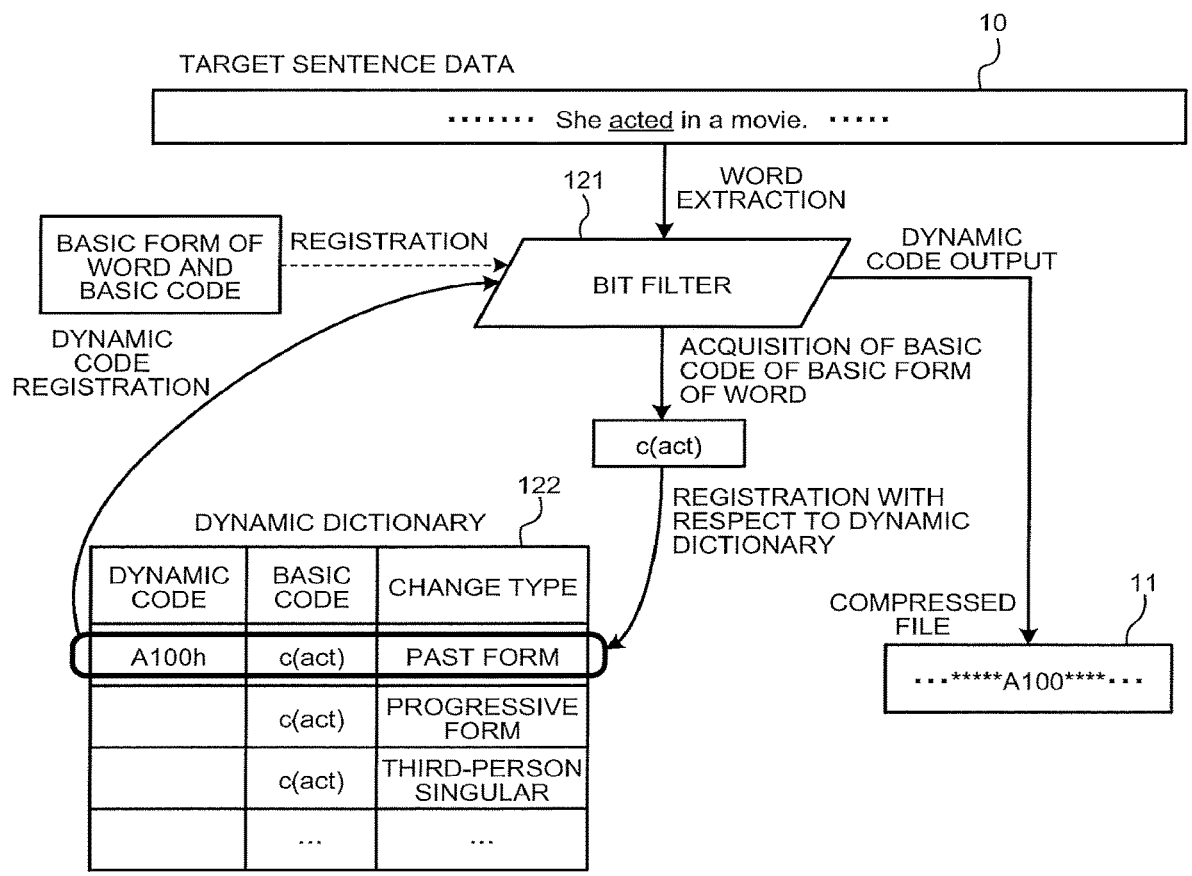
FIG. 1 is a diagram for describing encoding processing of a word of a first embodiment.

Encoding processing of an information processing device 100 of a first embodiment (refer to FIG. 2) will be described by using FIG. 1. FIG. 1 is a diagram for describing the encoding processing of a word of the first embodiment. As illustrated in the example of FIG. 1, the information processing device 100 separates "She acted in a movie . . . " included in target sentence data 10, which is an encoding processing target, to each numerical value or word such as "She", "acted", "in", "a", and "movie", acquires each of the numerical values or words, which is encoding target data. Hereinafter, the numerical value having a number of greater than or equal to 1 will be referred to as a numerical string. The numerical string may include a code such as a plus or a minus, a comma, and a decimal point, in addition to the number.

The information processing device 100 extracts, for example "acted" as the encoding target data, outputs the extracted encoding target data to a bit filter 121, and determines whether or not the extracted encoding target data is in an inflective form of the word. The bit filter 121 is a dictionary which associates a basic form of the word, and a dynamic code with each word. The basic form of each of the words, and a basic code corresponding to the basic form of the word are registered in advance in the bit filter 121. For example, the basic form of "act" of the word corresponding to the inflective form of "acted", "acting", "acts", . . . of the word, and the basic code of "c(act)" corresponding to the basic form of "act" of the word are registered in advance in the bit filter 121. Furthermore, in FIG. 1, the notation of "c(word)" indicates a basic code corresponding to the word in the parentheses. For example, "c(act)" indicates the basic code of "act". The details of a data structure of the bit filter 121 will be described below.

Next, in a case where the extracted encoding target data of "acted" is in the inflective form of the word, the information processing device 100 acquires the basic code of "c(act)" corresponding to the basic form of "act" of the word of "acted", from the bit filter 121. Next, the information processing device 100 registers the acquired basic code of "c(act)", a change type of the extracted word of "acted" (here, "past form"), and a dynamic code dynamically applied in the order of registration (here, "A100h") in a dynamic dictionary 122 in association with each other. Furthermore, "h" represented on the tailing of the dynamic code of "A100h" is a code indicating that it is noted in hexadecimal.

Next, the information processing device 100 registers the dynamic code of "A100h" dynamically applied in the dynamic dictionary 122, the basic form of "act" of the word, and the basic code of "c(act)" in the bit filter 121 in association with each other. Then, the information processing device 100 acquires the dynamic code of "A100h" corresponding to the word of "acted", on the basis of the bit filter 121 and the dynamic dictionary 122, and outputs the dynamic code of "A100h" to a compressed file 11.

In addition, in a case where the word of "acted" appears in the target sentence data 10 next time, the information processing device 100 acquires the dynamic code of "A100h" registered in advance in the bit filter 121, outputs the dynamic code to the compressed file 11.

Comparison Between First Embodiment and Reference Example

As described above, in the first embodiment, the encoding is performed by registering the inflective form of the word in the dynamic dictionary 122, but not in the bit filter 121, which is a static dictionary. On the other hand, in a reference example, the encoding is performed by registering the inflective form of the word in the bit filter 121, which is the static dictionary, as with the basic form of the word. As with the reference example, in a case where the inflective form of the word is registered in the static dictionary, the capacity of the static dictionary increases, and thus, there is a case where the compression ratio in a case of performing the encoding decreases. In contrast, in a case where the encoding is performed by registering the inflective form of the word in the dynamic dictionary 122, as with the first embodiment, it is possible to suppress an increase in the capacity static dictionary. Therefore, it is possible to improve the compression ratio at the time of performing the encoding, compared to the reference example.

Configuration of Processor Relevant to Encoding Processing of First Embodiment

Figure 2:
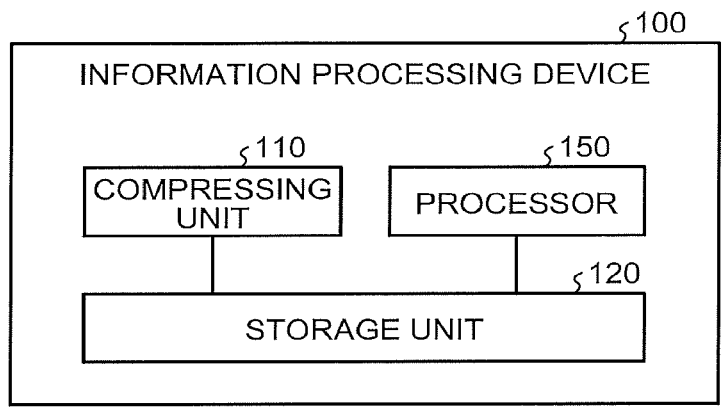
FIG. 2 is a diagram for describing an example of a system configuration of an information processing device.

A relationship between a compressing unit 110 and a storage unit 120 of the information processing device 100 will be described by using FIG. 2. FIG. 2 is a diagram for describing an example of a system configuration of the information processing device 100. As illustrated in the example of FIG. 2, the storage unit 120 of the information processing device 100 is connected to the compressing unit 110 and a processor 150. The storage unit 120, for example, corresponds to a semiconductor memory device such as a random access memory (RAM), a read only memory (ROM), and a flash memory, or a storage device such as a hard disk or an optical disk.

In addition, the information processing device 100 includes the compressing unit 110 and the processor 150. For example, a central processing unit (CPU) executes a predetermined program, and thus, functions of the compressing unit 110 and the processor 150 can be realized. In addition, the functions of the compressing unit 110 and the processor 150, for example, can be realized by an integrated circuit such as an application specific integrated circuit (ASIC) or a field programmable gate array (FPGA).

The compressing unit 110 extracts a word from input data. The compressing unit 110 converts the extracted word into a code corresponding to the word, with reference to a dictionary in which the word and the code are stored in association with each other.

Such a dictionary is a first dictionary in which basic forms of a plurality of predetermined words are stored in advance, and a second dictionary in which inflective forms of the words registered in the first dictionary are stored. In a case where the basic form of the extracted word is registered in the first dictionary, and a dynamic code corresponding to the inflective form of the word is not registered in the first dictionary, the compressing unit 110 applies the dynamic code to the word, and registers the dynamic code in association with the basic form of the word in the first dictionary. Furthermore, the first dictionary, for example, is the bit filter, and the second dictionary, for example, is the dynamic dictionary.

Figure 3:
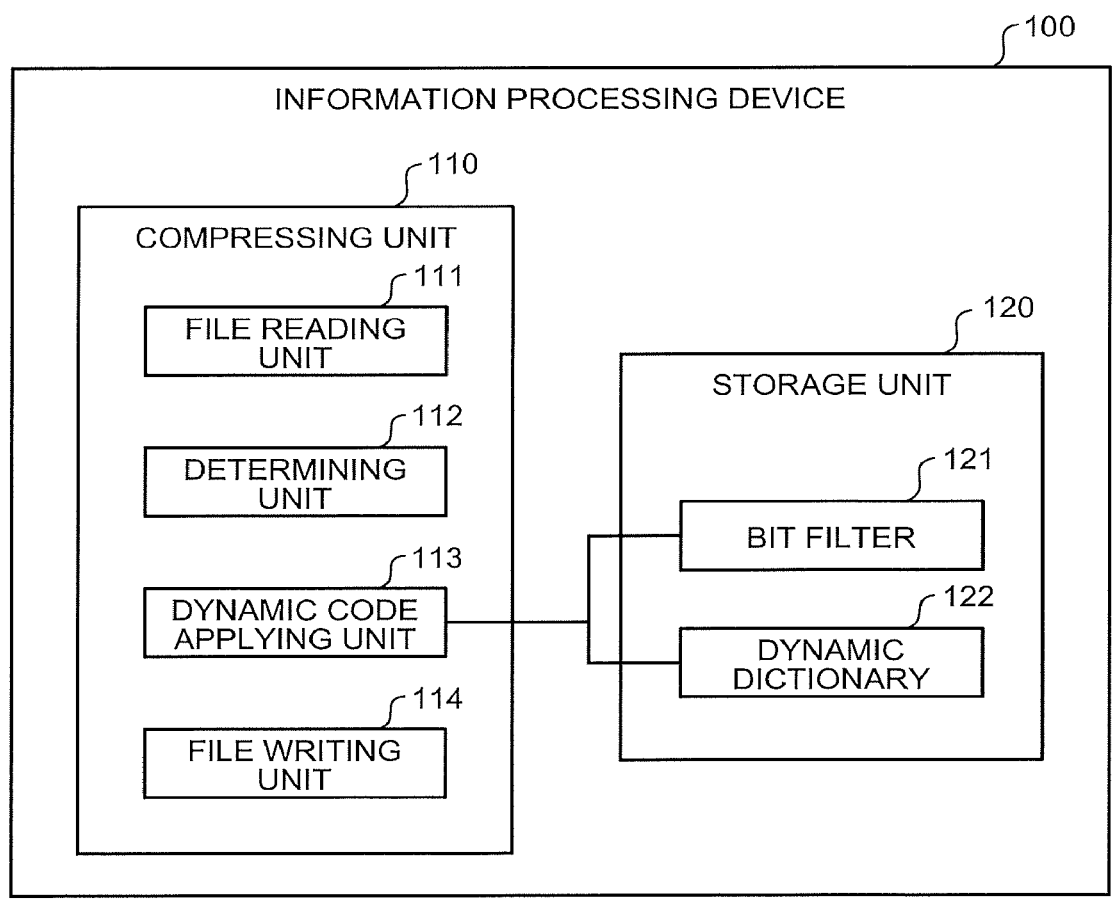
FIG. 3 is a diagram illustrating an example of a system configuration according to the encoding processing of the first embodiment.

A system configuration according to the encoding processing of the first embodiment will be described by using FIG. 3. FIG. 3 is a diagram illustrating an example of the system configuration according to the encoding processing of the first embodiment. As illustrated in the example of FIG. 3, the information processing device 100 includes the compressing unit 110 and the storage unit 120. The compressing unit 110 includes a file reading unit 111, a determining unit 112, a dynamic code applying unit 113, and a file writing unit 114. The storage unit 120 includes the bit filter 121 and the dynamic dictionary 122. Furthermore, the bit filter 121 is an example of the static dictionary, the dynamic code applying unit 113 is an example of the registering unit. Hereinafter, the configurations of the compressing unit 110 and the storage unit 120 of the first embodiment will be described in detail.

Each Configuration of Storage Unit

First, the bit filter 121 will be described. The bit filter 121 is a dictionary in which the basic code and the dynamic code are associated with the word having a high appearance frequency. FIG. 4 is a diagram illustrating a first example of the bit filter 121. As illustrated in the example of FIG. 4, the bit filter 121 associates 2 grams, a bit map, a word, a string length, an appearance frequency, a code length, a basic code, and a dynamic code with each other. "2 grams" is a serial number included in each word. For example, "act" includes 2 grams corresponding to "ac" and "ct".

"bit map" indicates a bit map corresponding to a string of 2 grams. For example, "act" is associated with a bit map of "1_0_0_0_0" of 2 grams of "ac", and a bit map of "0_1_0_0_0" 2 grams of "ct", by a pointer with respect to each of the words. For example, in a case where "act" is acquired from the target sentence data 10, the information processing device 100 accesses the word of "act" by using the bit map of "1_0_0_0_0" of 2 grams of "ac", the bit map of "0_1_0_0_0" of 2 grams of "ct", and a bit map of "0_0_1_0_0" of 2 grams of "tΔ". "word" is a word registered in the bit filter 121. For example, "word" is a word extracted in advance from a dictionary, a text group, or the like. Furthermore, the number of registrations of "word" may be arbitrary.

"string length" is a length of the string of the registered word. "appearance frequency" is the number of times when each of the words appears in a text file group for counting a frequency. Here, the text file group for counting a frequency is one or more text files for counting an appearance frequency of each of the words, which is prepared separately from the target sentence data 10.

The counting of the appearance frequency of the word will be described. The information processing device 100 reads in a text file for counting a frequency, suitably extracts the word existing in the text file group for counting a frequency, and registers the word in the bit filter 121. Further, the information processing device 100 counts the number of times of appearance in the text file group for counting a frequency, as the appearance frequency, with respect to each of the words registered in the bit filter 121. For example, in the example of FIG. 4, the bit filter 121 illustrates a word of "a" appears in the text file group for counting a frequency, "9738" times.

"basic code" is a code which is assigned to the basic form of each of the words. The information processing device 100 assigns a code having a shorter code length with respect to the word having a high appearance frequency. Furthermore, in the example of FIG. 4, an example is illustrated in which data of each item is stored in association with a record, and in the above description, in a case of retaining a relationship between the items associated with each other, the data may be stored according to another storing method. The same applies to the bit filter 121 and the dynamic dictionary 122 illustrated in FIG. 5 and FIG. 6 described below.

Next, the dynamic dictionary 122 will be described. The dynamic dictionary 122 is a dictionary in which the basic code corresponding to the basic form of the word, the change type of the word, and the applied dynamic code are associated with each other. FIG. 5 is a diagram illustrating an example of the dynamic dictionary 122. As illustrated in the example of FIG. 5, the dynamic dictionary 122 associates the dynamic code, and the basic code and the change type of the word with each other. "basic code" is a basic code registered in the bit filter 121. "change type" is a change type indicating how the basic form of the word is changed. "dynamic code", for example, is a dynamic code of a fixed length, which is applied in an ascending order to the basic code and the change type, in the order of registration in the dynamic dictionary 122.

For example, in a case where the inflective form of the word is sequentially extracted from the target sentence data 10, the information processing device 100 assigns the dynamic codes of "A100h", "A101h", "A102h", "A103h", . . . with respect to the inflective form of each of the words. For example, in a case where "acted", "eating", . . . are sequentially extracted from the target sentence data 10, whether or not the extracted word is in the inflective form is determined, and in a case where the extracted word is in the inflective form, the change type of the extracted word is determined. Then, in a case where the extracted word is in the inflective form, as illustrated in the example of FIG. 5, the dynamic code of "A100h" is assigned with respect to the basic code of "6041h" and the change type of "past form" in the basic form of "act" of the word, and then, the dynamic code of "A101h" is assigned with respect to the basic code of "60F5h" and the change type of "progressive form" in the basic form of "eat" of the word.

Each Configuration of Compressing Unit

Returning to FIG. 3, each configuration of the compressing unit 110 will be described. The file reading unit 111 is a processor which reads out the target sentence data 10, and extracts the encoding target data from the target sentence data 10. The file reading unit 111 separates the string to each of the words or each numerical notation string by a space character, a comma, or the like in the string of the target sentence data 10, and extracts each of the encoding target data items from the target sentence data 10. Then, the file reading unit 111 outputs the extracted encoding target data to the determining unit 112.

The determining unit 112 is a processor which determines whether or not the encoding target data extracted from the target sentence data 10 is in the inflective form of the word, and in a case where the extracted encoding target data is in the inflective form of the word, determines the basic form and the change type of the extracted word. Then, in a case where the extracted encoding target data is in the inflective form of the word, the determining unit 112 outputs the inflective form of the extracted word, and the information of the basic form and the change type of the word to the dynamic code applying unit 113.

The dynamic code applying unit 113 is a processor which applies the dynamic code to the inflective form of the word extracted from the target sentence data 10. In a case where the inflective form of the word is received from the determining unit 112, the dynamic code applying unit 113 accesses the inflective form of the extracted word, with reference to the basic form of the word registered in the bit filter 121.

In a case where the dynamic code corresponding to the accessed inflective form of the word is registered in advance in the bit filter 121, the dynamic code applying unit 113 acquires the dynamic code corresponding to the inflective form of the word from the bit filter 121, and outputs the dynamic code to the file writing unit 114.

On the other hand, in a case where the dynamic code corresponding to the inflective form of the accessed word is not registered in the bit filter 121, the dynamic code applying unit 113 acquires the basic code corresponding to the basic form of the word from the bit filter 121. Next, the dynamic code applying unit 113 registers the basic code acquired from the bit filter 121, the dynamic code applied to the dynamic dictionary 122 in the order of registration, and the change type of the word in the dynamic dictionary 122 in association with each other.

A specific example of the registration of the dynamic code with respect to the dynamic dictionary 122 will be described by using FIG. 5. As illustrated in the example of FIG. 5, the dynamic code applying unit 113 registers the basic code of "6041h" and the change type of "past form" corresponding to the basic form of "act" of the word, and the dynamic code of "A100h" in the dynamic dictionary 122 in association with each other, with respect to the word of "acted" registered first. In addition, the dynamic code applying unit 113 registers the basic code of "60F5h" and the change type of "progressive form" corresponding to the basic form of "eat" of the word, and the dynamic code of "A101h" in the dynamic dictionary 122 in association with each other, with respect to the word of "eating" registered second. Thus, the dynamic code applying unit 113 applies the corresponding dynamic code to the dynamic dictionary 122 in the order of registration, with respect to the inflective form of the extracted word, and registers the basic code and the change type corresponding to the basic form of the word, and the applied dynamic code, in the dynamic dictionary 122 in association with each other.

Next, the dynamic code applying unit 113 registers the dynamic code registered in the dynamic dictionary 122, and the basic form of the word in the bit filter 121 in association with each other.

A specific example of the bit filter 121 after a registration number and the dynamic code are registered, will be described by using FIG. 6. FIG. 6 is a diagram illustrating a second example of the bit filter 121. As illustrated in the example of FIG. 6, the dynamic code is registered in the bit filter 121. In the bit filter 121, "dynamic code" is a dynamic code corresponding to the inflective form of the word. For example, the dynamic code of "A100h" applied to the inflective form of "acted" of the word corresponding to the basic form of "act" of the word is registered in the bit filter 121. Furthermore, the dynamic code is registered with respect to the change type of the word.

Then, the dynamic code applying unit 113 outputs the dynamic code registered in the bit filter 121 to the file writing unit 114.

The file writing unit 114 is a processor which generates the compressed file 11 on the basis of the dynamic code output from the dynamic code applying unit 113. The file writing unit 114, for example, stores each dynamic code corresponding to the inflective form of the word output from the dynamic code applying unit 113, in a buffer, and generates the compressed data. The file writing unit 114 generates the compressed file 11 on the basis of the compressed data generated in the buffer.

Flow of Encoding Processing of First Embodiment

Figure 7:
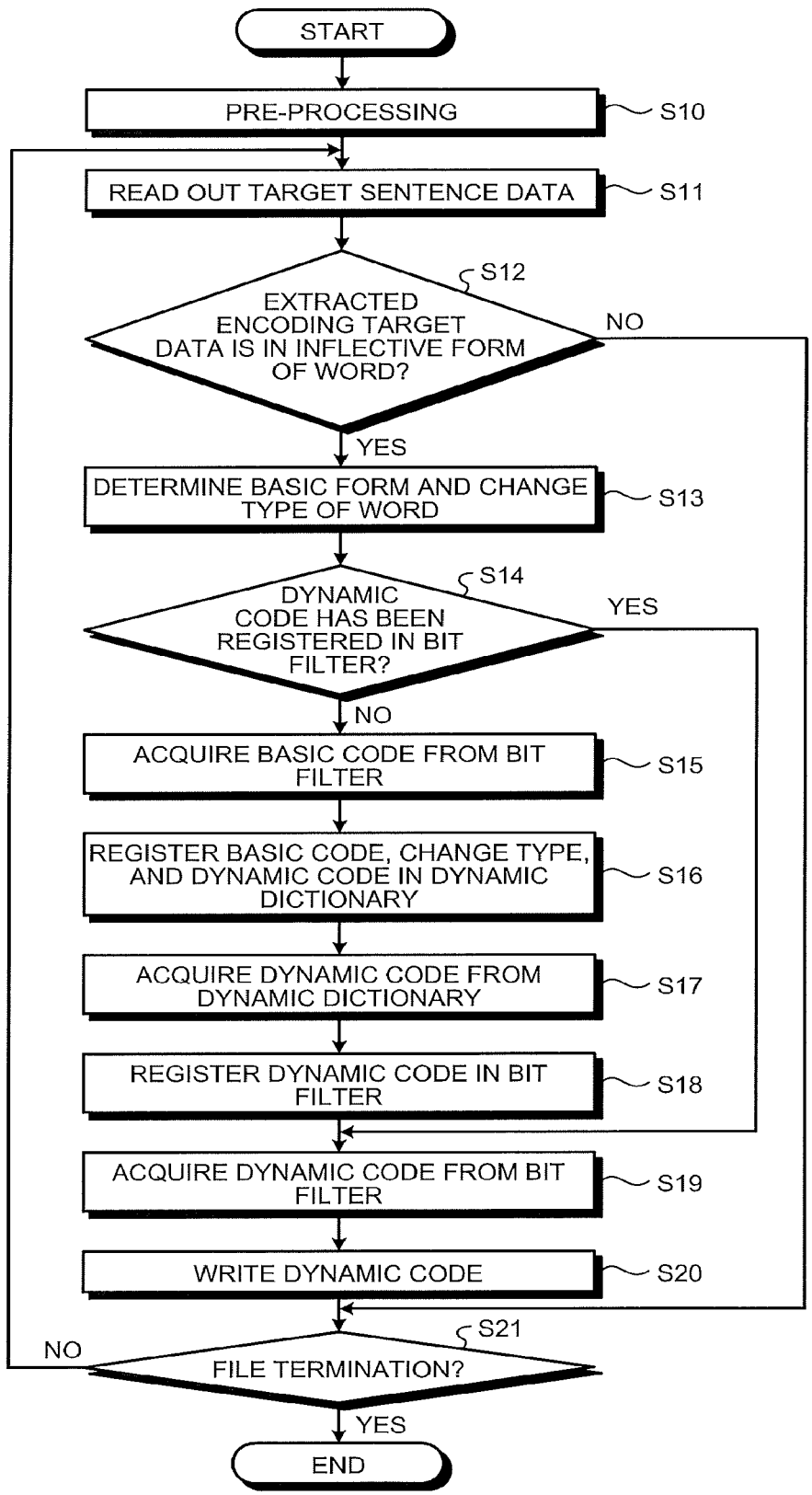
FIG. 7 is a diagram illustrating an example of a flow of the encoding processing of the first embodiment.

Next, a flow of the encoding processing of the first embodiment will be described. FIG. 7 is a diagram illustrating an example of the flow of the encoding processing of the first embodiment. As illustrated in the example of FIG. 7, the information processing device 100 initially performs pre-processing (Step S10). For example, the information processing device 100 ensures an area retaining the bit filter 121, and a working area preparing the dynamic dictionary 122, in the pre-processing. Next, the file reading unit 111 reads out the target sentence data 10 (Step S11). Next, the determining unit 112 determines whether or not the encoding target data extracted from the read target sentence data 10 is in the inflective form of the word (Step S12). Then, in a case where the extracted encoding target data is not in the inflective form of the word (Step S12, No), the process proceeds to the processing of Step S21.

On the other hand, in a case where the extracted encoding target data is in the inflective form of the word (Step S12, Yes), the determining unit 112 determines the basic form and the change type of the extracted word (Step S13). Then, the dynamic code applying unit 113 determines whether or not the dynamic code corresponding to the inflective form of the word extracted from the target sentence data 10 is registered in the bit filter 121 (Step S14). Then, in a case where the dynamic code is registered in the bit filter 121 (Step S14, Yes), the dynamic code applying unit 113 proceeds to the processing of Step S19.

On the other hand, in a case where the dynamic code is not registered in the bit filter 121 (Step S14, No), the dynamic code applying unit 113 acquires the basic code corresponding to the basic form of the word extracted from the bit filter 121 (Step S15). Next, the dynamic code applying unit 113 registers the basic code acquired from the bit filter 121, the change type of the inflective form of the word, and the dynamic code applied in the order of registering the inflective form of the word in the dynamic dictionary 122 in the dynamic dictionary 122 in association with each other (Step S16). For example, the dynamic code applying unit 113 applies the dynamic codes of "A100h", "A101h", "A102h", "A103h", "A104h", "A105h", . . . to the inflective form of the word (that is, a combination between the basic code and the change type of the word), in the order of registering the inflective form of the word in the dynamic dictionary 122. The dynamic code applying unit 113 acquires the dynamic code registered from the dynamic dictionary 122 (Step S17). Next, the dynamic code applying unit 113 registers the dynamic code acquired from the dynamic dictionary 122 and the basic form of the word in the bit filter 121 in association with each other (Step S18).

Next, the dynamic code applying unit 113 acquires the dynamic code corresponding to the inflective form of the word from the bit filter 121 (Step S19). Then, the file writing unit 114 writes the dynamic code acquired from the bit filter 121 in the compressed file 11 (Step S20).

Next, the file reading unit 111 determines whether or not a reading position of a file is on a termination of the file (Step S21). In a case where the reading position is on the termination of the file (Step S21, Yes), the file reading unit 111 ends the processing. On the other hand, in a case where reading position is in the middle of the file (Step S21, No), the file reading unit 111 returns to the processing of Step S11.

As described above, the information processing device 100 of the first embodiment assigns the inflective form of each of the words included in the target sentence data 10 to the dynamic code, and thus, is capable of decreasing a code length assigned to the inflective form of the word at the time of performing the encoding processing.

Effect

At the time of encoding the encoding target data included in the target sentence data 10, the compressing unit 110 determines whether or not the encoding target data is in the inflective form of the word, and in a case where the encoding target data is in the inflective form of the word, registers the encoding target data and the code in the dynamic dictionary 122 in association with each other. Accordingly, it is possible to improve the compression ratio in a case of performing the encoding by assigning the individual code to the word having a high appearance frequency.

In the determining processing of the compressing unit 110, it is determined whether or not the encoding target data is in the inflective form of the word registered in the static dictionary (the bit filter 121). Accordingly, it is possible to perform the encoding at a high compression ratio by assigning the individual code to the word having a high appearance frequency.

[b] Second Embodiment

Figure 8:
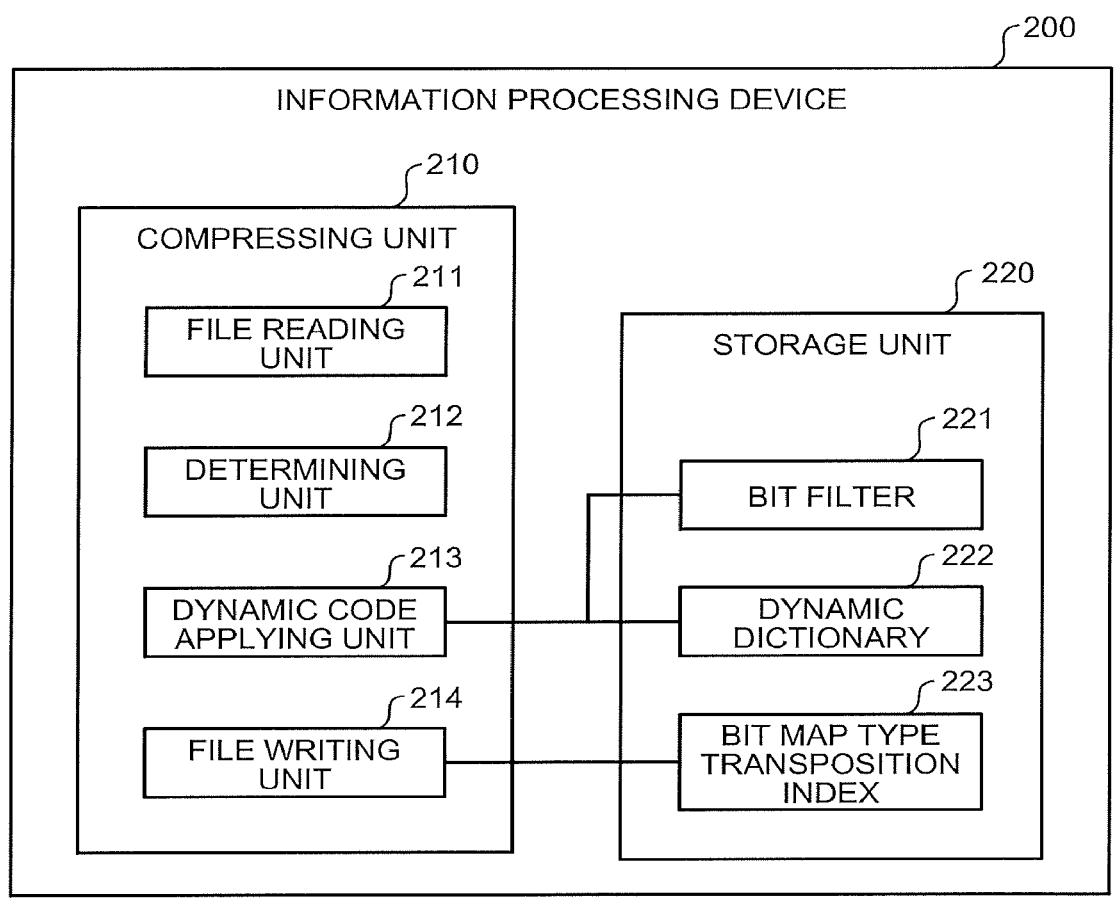
FIG. 8 is a diagram illustrating an example of a system configuration according to index generating processing of a second embodiment.

A system configuration according to index generating processing of a second embodiment will be described by using FIG. 8. FIG. 8 is a diagram illustrating an example of the system configuration according to the index generating processing of the second embodiment. As illustrated in the example of FIG. 8, an information processing device 200 includes a compressing unit 210 and a storage unit 220. The compressing unit 210 includes a file reading unit 211, a determining unit 212, a dynamic code applying unit 213, and a file writing unit 214. The storage unit 220 stores a bit filter 221, a dynamic dictionary 222, and a bit map type transposition index 223. Furthermore, the last two digits of the numbers are identical to those of the first embodiment, with respect to the same configurations as those of the first embodiment, and the description thereof will be suitably omitted.

The compressing unit 210 updates the bit map type transposition index 223 that associates and retains an information bit string indicating a compressed file including the basic form and the inflective form of the word, in a plurality of compressed files, with the basic form and the inflective form each of the words, at the time of extracting the basic form and the inflective form of the word in the extracting processing. Furthermore, the file writing unit 214 is an example of the index registering unit, and the bit map type transposition index 223 is an example of the index. Hereinafter, the configurations of the compressing unit 210 and the storage unit 220 of the second embodiment will be described in detail.

Figure 9:
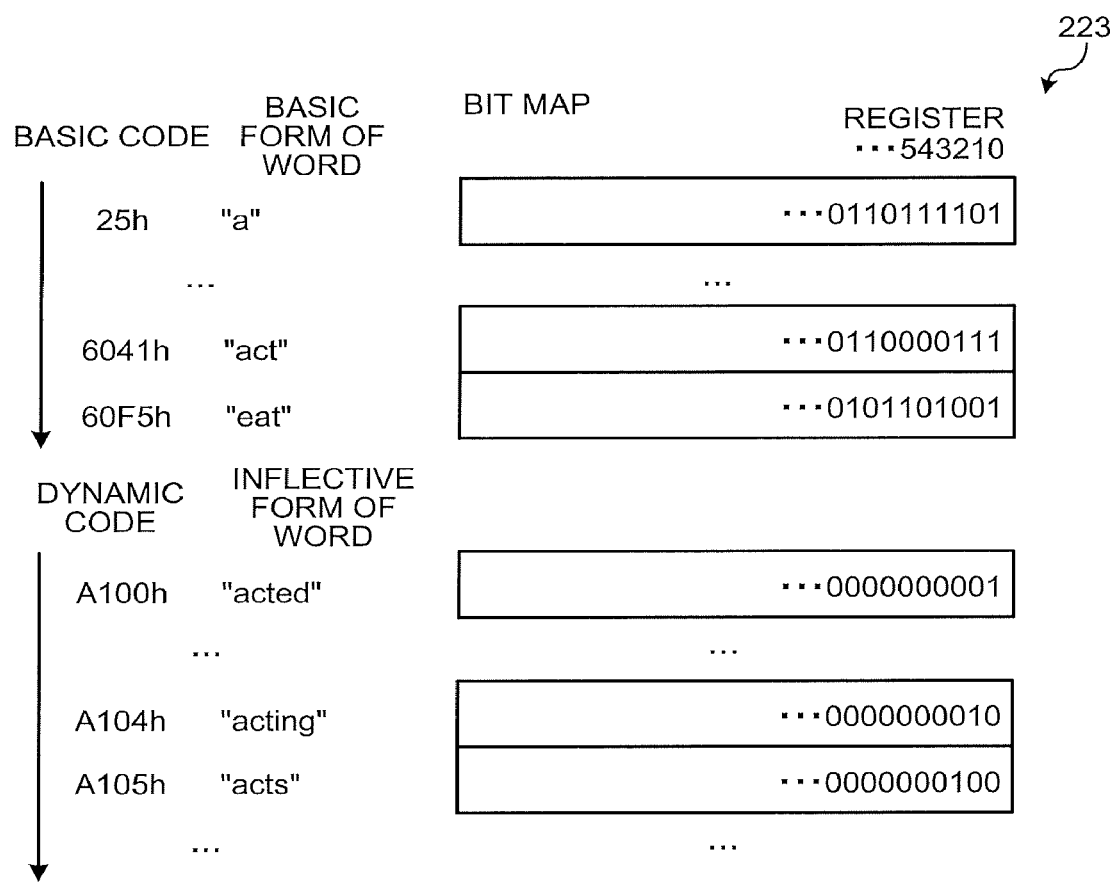
FIG. 9 is a diagram illustrating an example of a bit map type transposition index.

The information processing device 200 of the second embodiment is different from the information processing device 100 of the first embodiment, from the viewpoint that the storage unit 220 stores the bit map type transposition index 223. A data structure of the bit map type transposition index 223 will be described by using FIG. 9. FIG. 9 is a diagram illustrating an example of the bit map type transposition index 223. As illustrated in the example of FIG. 9, the bit map type transposition index 223 associates the bit map with the basic code according to the basic form of the word or the dynamic code according to the inflective form of the word. The bit map is a code bit string indicating the compressed file in which both of the basic form and the inflective form of the word are included. Each bit of the bit map indicates that the basic form or the inflective form of the word is included in each of the compressed files.

The bit map type transposition index 223, for example, associates the bit map with the basic form of the word having a high appearance frequency, and the inflective form of the word. In a case where the appearance frequency of each of the words is counted in the appearance text file group for counting a frequency, the word having a high appearance frequency indicates a word having a high appearance frequency.

For example, in the first effective row of the bit map type transposition index 223, the bit map of the basic form of "a" of the word corresponding to the basic code of "25h" is " . . . 0110111101". The bit map in the first effective row of the bit map type transposition index 223 indicates a file in which the basic code of the basic form of "a" of the word is included. The bit map of " . . . 0110111101" indicates that the basic form of "a" of the word is included in a file 1 since "1" is stored in the zeroth register, the basic form of "a" of the word is not included in a file 2 since "0" is stored in the first register, and the basic form of "a" of the word is included in a file 3 since "1" is stored in the second register. In addition, the bit map of " . . . 0110111101" indicates that the basic form of "a" of the word is included in a file 4 since "1" is stored in the third register, and the basic form of "a" the word is included in a file 5 since "1" is stored in the fourth register. Furthermore, the bit map of " . . . 0110111101" indicates whether or not the basic form of "a" of the word is included in each of the other files from the sixth file.

Next, the updating of the bit map type transposition index 223 will be described. The file writing unit 214 determines whether or not the basic code or the dynamic code received from the dynamic code applying unit 213 is registered in the bit map type transposition index 223. In a case where the bit map corresponding to the received basic code or dynamic code is registered in the bit map type transposition index 223, the file writing unit 214 refers to the bit map corresponding to the received basic code or dynamic code. In a case where the bit corresponding to a target file is "O", in the referred-to bit map, the file writing unit 214 updates the bit to "1". Furthermore, in a case where the bit corresponding to the target file is "1", the file writing unit 214 does not update the bit map.

On the other hand, in a case where the bit map corresponding to the received basic code or dynamic code is not registered in the bit map type transposition index 223, the file writing unit 214 newly registers the bit map in the bit map type transposition index 223.

Specifically, in a case where the dynamic code applying unit 213 registers the inflective form of the word in the target file in the dynamic dictionary 222, the file writing unit 214 acquires the dynamic code which is applied to the inflective form of the word. In such a case, the file writing unit 214 registers the bit map according to the acquired dynamic code in the bit map type transposition index 223. The bit of "0" corresponding to the number of target files is included in the bit map. Further, in the bits of the registered bit map, the file writing unit 214 updates the bit corresponding to the target file to "1". That is, when the inflective form of the word, which appears first in the target file, is registered in the dynamic dictionary 222, the file writing unit 214 registers the bit map corresponding to the inflective form of the word which is registered in the bit map type transposition index 223. Thus, the bit map type transposition index 223 is generated.

Flow of Index Generating Processing of Second Embodiment

Figure 10:
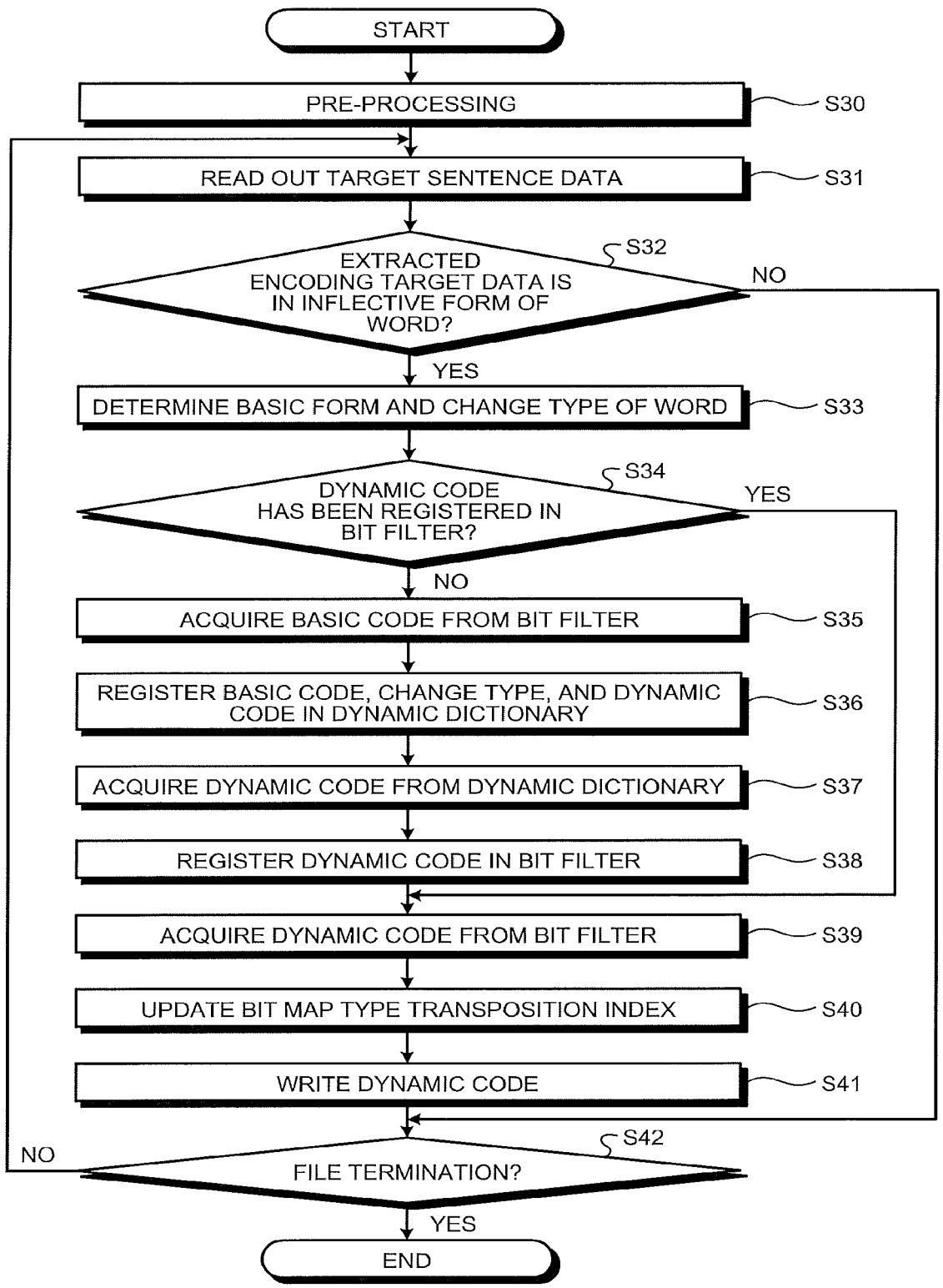
FIG. 10 is a diagram illustrating an example of a flow of the index generating processing of the second embodiment.

Next, a flow of index generating processing of the second embodiment will be described. FIG. 10 is a diagram illustrating an example of the flow of the index generating processing of the second embodiment. As illustrated in the example of FIG. 10, the information processing device 200 initially performs pre-processing (Step S30). For example, the information processing device 200 ensures an area retaining the bit filter 221 or a working area preparing the dynamic dictionary 222, in the pre-processing. Next, the file reading unit 211 reads out the target sentence data 10 (Step S31). Next, the determining unit 212 determines whether or not the encoding target data extracted from the read target sentence data 10 is in the inflective form of the word (Step S32). Then, in a case where the extracted encoding target data is not in the inflective form of the word (Step S32, No), the process proceeds to the processing of Step S42.

On the other hand, in a case where the extracted encoding target data is in the inflective form of the word (Step S32, Yes), the determining unit 212 determines the basic form and the change type of the extracted word (Step S33). Then, the dynamic code applying unit 213 determines whether or not the dynamic code corresponding to the inflective form of the word extracted from the target sentence data 10 is registered in the bit filter 221 (Step S34). Then, in a case where the dynamic code is registered in the bit filter 221 (Step S34, Yes), the dynamic code applying unit 213 proceeds to the processing of Step S39.

On the other hand, in a case where the dynamic code is not registered in the bit filter 221 (Step S34, No), the dynamic code applying unit 213 bit acquires the basic code corresponding to the basic form of the word extracted from the bit filter 221 (Step S35). Next, the dynamic code applying unit 213 registers the basic code acquired from the bit filter 221, the change type of the inflective form of the word, and the dynamic code applied in the order of registering the inflective form of the word in the dynamic dictionary 222 in the dynamic dictionary 222 in association with each other (Step S36). For example, the dynamic code applying unit 213 applies the dynamic codes of "A100h", "A101h", "A102h", "A103h", "A104h", "A105h", . . . to the inflective form of the word (that is, a combination between the basic code and the change type of the word), in the order where the inflective form of the word is registered in the dynamic dictionary 222. The dynamic code applying unit 213 acquires the dynamic code registered from the dynamic dictionary 222 (Step S37). Next, the dynamic code applying unit 213 registers the dynamic code acquired from the dynamic dictionary 222 and the basic form of the word in the bit filter 221 in association with each other (Step S38). Next, the dynamic code applying unit 213 acquires the dynamic code corresponding to the inflective form of the word from the bit filter 221 (Step S39).

Next, the file writing unit 214 updates the bit map type transposition index 223, on the basis of the dynamic code acquired by the dynamic code applying unit 213, and the basic code associated with the dynamic code (Step S40). For example, in a case where the bit map corresponding to the dynamic code is registered in the bit map type transposition index 223, the file writing unit 214 updates the bit corresponding to the target file to "1", in the bits included in the bit map. On the other hand, in a case where the bit map corresponding to the dynamic code is not registered in the bit map type transposition index 223, the file writing unit 214 newly registers the bit map corresponding to the dynamic code in the bit map type transposition index 223.

Then, the file writing unit 214 writes the dynamic code acquired from the bit filter 221 in the compressed file 11 (Step S41).

Next, the file reading unit 211 determines whether or not the reading position of the file is on the termination of the file (Step S42). In a case where the reading position is on the termination of the file (Step S42, Yes), the file reading unit 211 ends the processing. On the other hand, in a case where the reading position is in the middle of the file (Step S42, No), the file reading unit 211 returns to the processing of Step S31.

As described above, the information processing device 200 of the second embodiment generates the bit map type transposition index 223 at the time of performing file compression. Accordingly, when the word is searched on the basis of a plurality of compressed files, the information processing device 200 is capable of specifying a file including the basic form or the inflective form of the word, in the search target, and of narrowing the compressed file to be opened, and thus, is capable of speeding up the word search.

Effect

When the encoding target data included in the target sentence data 10 is encoded, the compressing unit 210 determines whether or not the encoding target data is in the inflective form of the word, and in a case where the encoding target data is in the inflective form of the word, the encoding target data and the code are registered in the dynamic dictionary 222 in association with each other, and the basic form and the inflective form of the word, and the encoding target data are registered in the index (the bit map type transposition index 223) in association with each other. Accordingly, when the word search is performed on the basis of the plurality of compressed files, it is possible to specify the file including the basic form or the inflective form of the word, in the search target, and to narrow the compressed file to be opened, and thus, it is possible to speed up the word search.

[c] Third Embodiment

Figure 11:
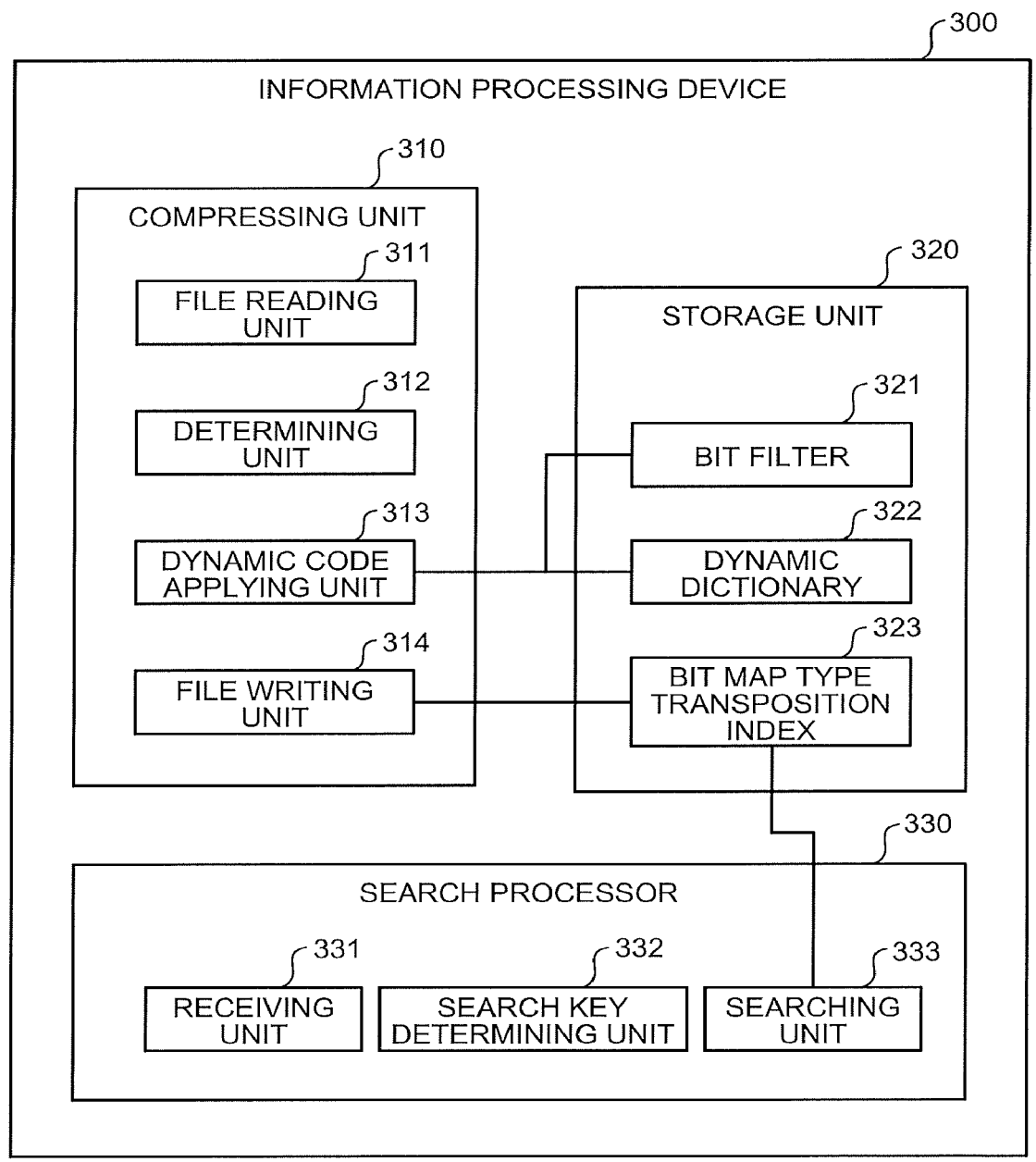
FIG. 11 is a diagram illustrating an example of a system configuration according to search processing of a third embodiment.

A system configuration according to search processing of a third embodiment will be described by using FIG. 11. FIG. 11 is a diagram illustrating the system configuration according to the search processing of the third embodiment. As illustrated in the example of FIG. 11, an information processing device 300 includes a compressing unit 310, a storage unit 320, and a search processor 330. The compressing unit 310 includes a file reading unit 311, a determining unit 312, a dynamic code applying unit 313, and a file writing unit 314. The storage unit 320 stores a bit filter 321, a dynamic dictionary 322, and a bit map type transposition index 323. The search processor 330 includes a receiving unit 331, a search key determining unit 332, and a searching unit 333. Furthermore, the bit map type transposition index 323 is an example of the index. In addition, the last two digits of the numbers are identical to those of the first embodiment and the second embodiment, with respect to the same configurations as those of the first embodiment and second embodiment, and the description thereof will be suitably omitted.

When the bit map type transposition index 323 is prepared, the search processor 330 searches for the word corresponding to a search key from the plurality of compressed files, with reference to the bit map type transposition index 323. Hereinafter, the configuration of the search processor 330 of the third embodiment will be described in detail.

The information processing device 300 of the third embodiment is different from the information processing device 200 of the second embodiment from the viewpoint of including the search processor 330. The receiving unit 331 receives a search request with respect to the target sentence data 10 which is encoded by the method described in the second embodiment. The search key determining unit 332 determines whether or not the search key included in the search request is in the inflective form of the word. In a case where the search key is in the inflective form of the word, the searching unit 333 performs a search corresponding to the search request, with reference to the bit map type transposition index 323.

Figure 12:
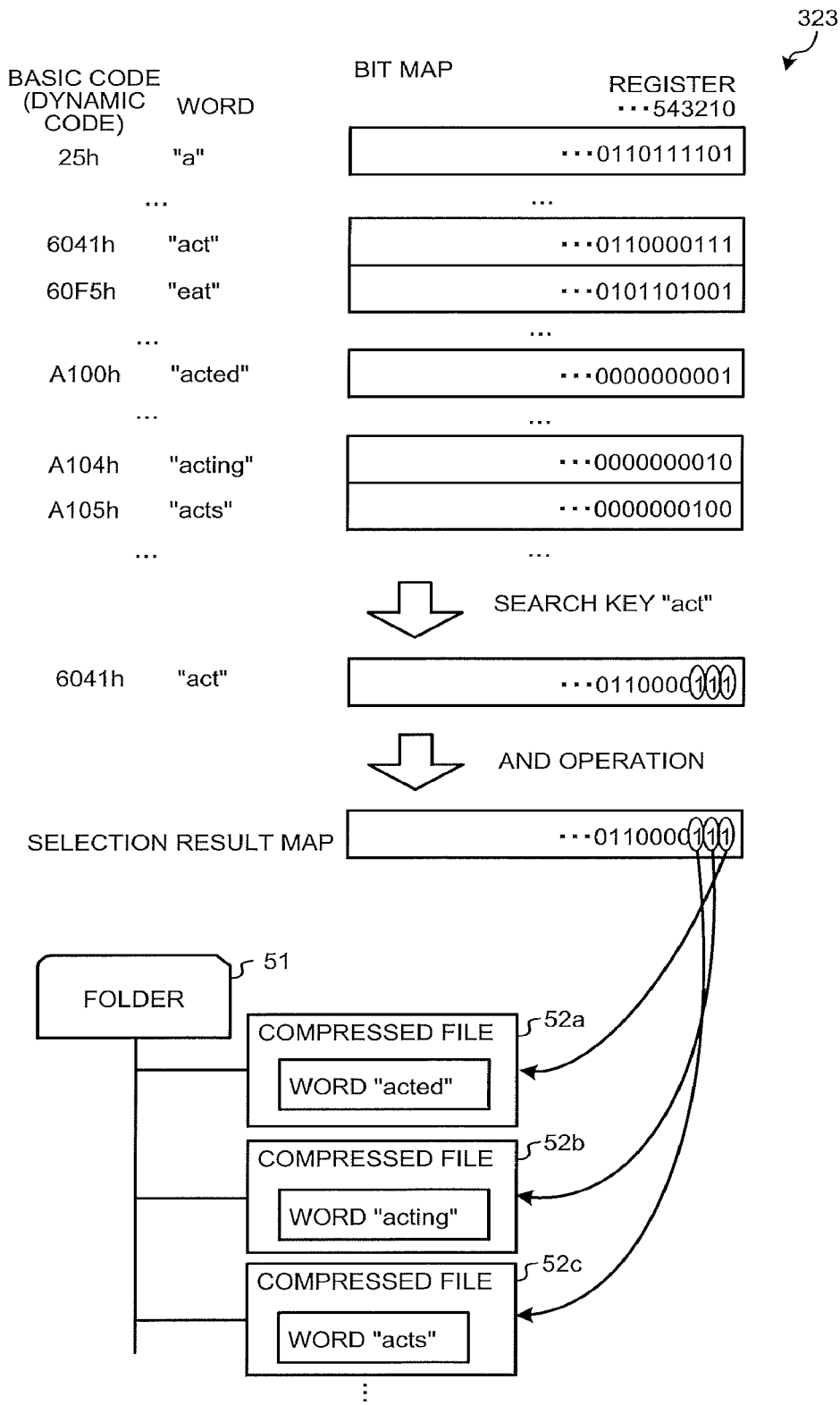
FIG. 12 is a diagram illustrating an example of a flow of compressed file selecting processing.

Next, a flow of word search processing according to the third embodiment will be described. FIG. 12 is a diagram illustrating an example of a flow of compressed file selecting processing. As illustrated in the example of FIG. 12, for example, in a case where the search key is "act", the search key determining unit 332 determines whether or not the search key is in the inflective form of the word. Here, the search key of "act" is in the basic form of the word but not in the inflective form, and thus, the searching unit 333 acquires the basic code of "6041h" corresponding to the search key from the bit filter 321, and extracts the bit map of the acquired basic code. Next, the searching unit 333 performs an AND operation with respect to the bit map extracted in a search range, and generates a selection result map of " . . . 0110000111". The generated selection result map of " . . . 0110000111" indicates the compressed file including the word of "act".

Here, as illustrated in the example of FIG. 12, a plurality of compressed files 52a, 52b, 52c, . . . are included in a folder 51. The selection result map is " . . . 0110000111", and thus, the searching unit 333 opens the first compressed file 52a, the second compressed file 52b, and the third compressed file 52c in the files included in the folder 51. Furthermore, the searching unit 333 opens the eighth compressed file and the ninth compressed file. For example, the word of "acted" belonging to the search key of "act" is stored in the compressed file 52a opened by the searching unit 333.

Figure 13:
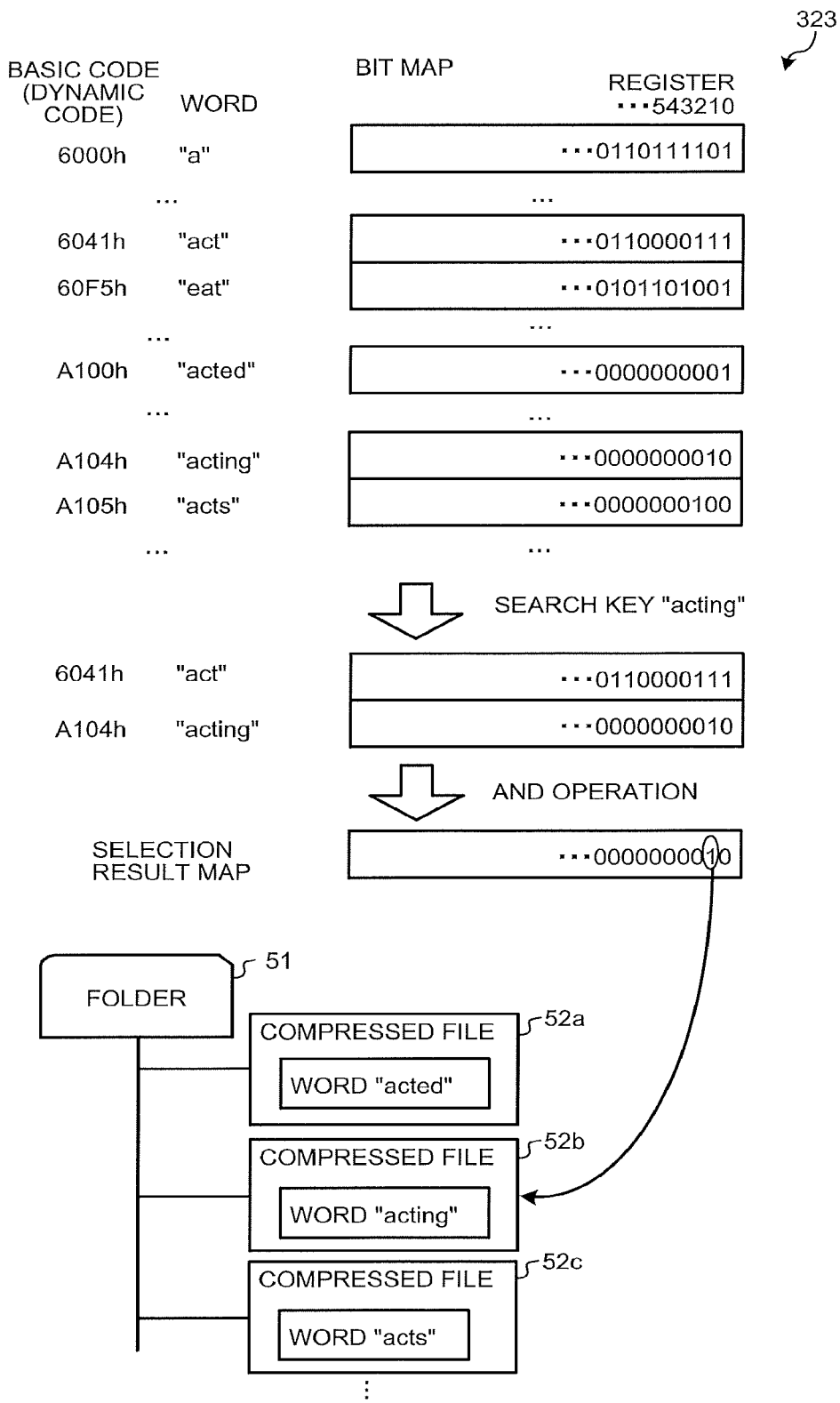
FIG. 13 is a diagram illustrating another example of the flow of the compressed file selecting processing.

FIG. 13 is a diagram illustrating another example of the flow of the compressed file selecting processing. As illustrated in the example of FIG. 13, for example, in a case where the search key is "acting", the search key determining unit 332 determines whether or not the search key is in the inflective form of the word. Here, the search key of "acting" is in the inflective form of the word, and thus, the search key determining unit 332 determines the basic form of "act" and the change type of "progressive form" of the search key of "acting". Subsequently, the searching unit 333 acquires the basic code of "6041h" and the dynamic code of "A104h" corresponding to the search key, and extracts the bit map of the acquired basic code and dynamic code. Next, the searching unit 333 performs the AND operation with respect to the bit map extracted in the search range, and generates a selection result map of " . . . 0000000010". The generated selection result map of " . . . 0000000010" indicates the compressed file including the word of "acting".

Here, the selection result map is " . . . 0000000010", and thus, the searching unit 333 opens the second compressed file 52b, in the files included in the folder 51. The word of "acting" belonging to the search key of "acting" is stored in the compressed file 52b opened by the searching unit 333.

Flow of Search Processing of Third Embodiment

Figure 14:
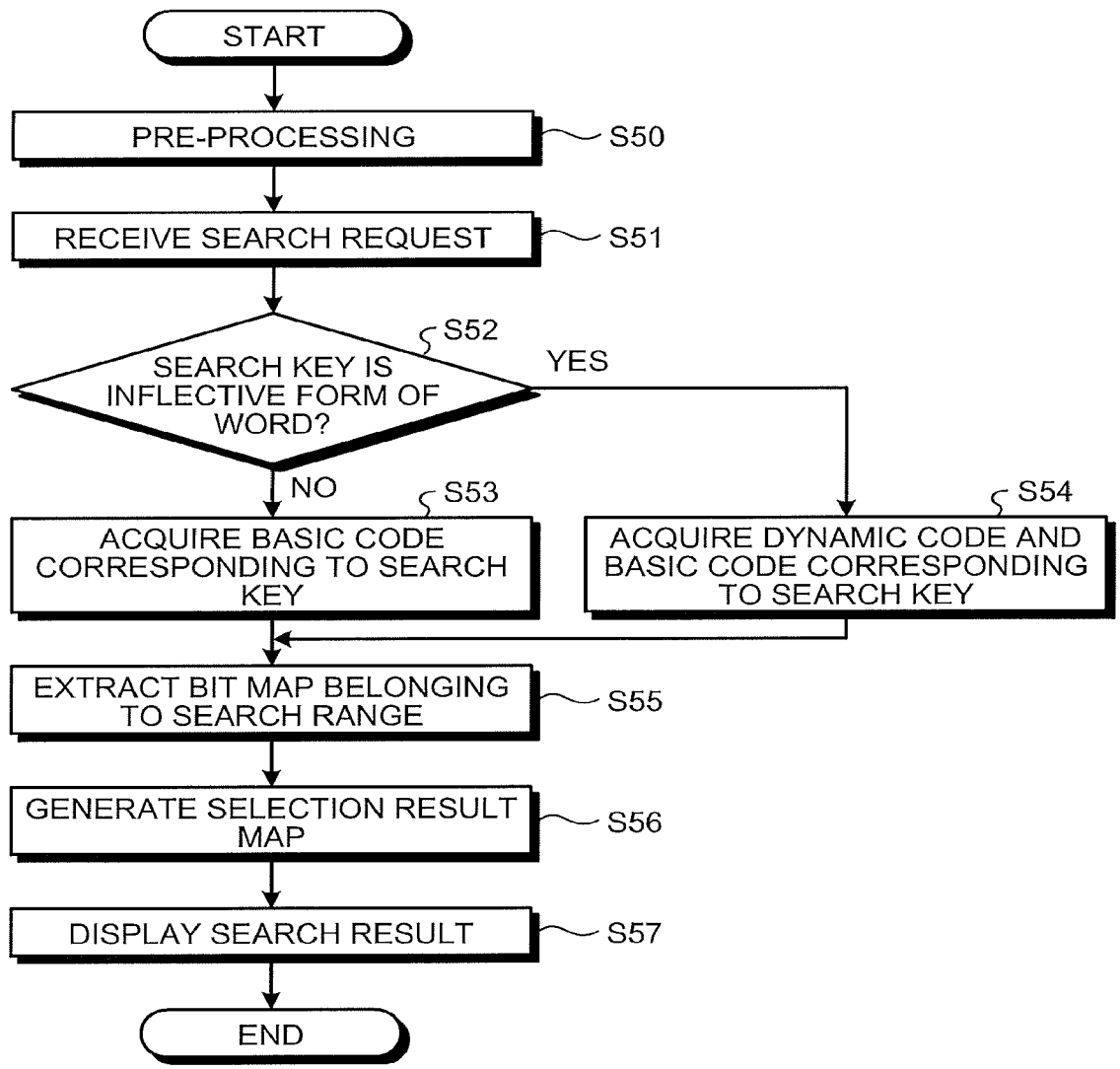
FIG. 14 is a diagram illustrating an example of a flow of search processing of the third embodiment.

Next, a flow of search processing of the third embodiment will be described. FIG. 14 is a diagram illustrating the flow of the search processing of the third embodiment. As illustrated in the example of FIG. 14, the information processing device 300 performs pre-processing (Step S50). For example, the information processing device 300 ensures a working area for generating the selection result map as the pre-processing.

Next, the receiving unit 331 receives the search request as the search key (Step S51). Then, the search key determining unit 332 determines whether or not the received search key is in the inflective form of the word (Step S52). Here, in a case where the received search key is not in the inflective form of the (Step S52, No), the search key determining unit 332 acquires the basic code corresponding to the basic form of the word received as the search key (Step S53). On the other hand, in a case where the received search key is in the inflective form of the word (Step S52, Yes), the search key determining unit 332 acquires the dynamic code corresponding to the inflective form of the word received as the search key, and the basic code corresponding to the basic form of the word (Step S54).

Next, the searching unit 333 extracts the bit map belonging to the search range from the bit map type transposition index 323, on the basis of the acquired basic code or dynamic code (Step S55). Subsequently, the searching unit 333 performs the AND operation corresponding to a plurality of words of a search query in a plurality of bit maps extracted from the bit map type transposition index 323, and thus, generates the selection result map (Step S56). Then, the searching unit 333 selects the compressed file to be opened on the basis of the generated selection result map, displays the search result relevant to the selected compressed file (Step S57), and ends the processing.

Effect

The information processing device 300 receives the search request with respect to the encoding sentence data in which the target sentence data 10 is encoded, and determines whether or not the search key included in the search request is in the inflective form of the word, and in a case where the search key is in the inflective form of the word, performs a search corresponding to the search request, with reference to the index (the bit map type transposition index 323) in which the basic form and the inflective form of the word, and the encoding target data included in the target sentence data 10 are associated with each other. Accordingly, it is possible to speed up the search in a synonym such as the basic form and the inflective form of the word.

Other Aspects Relevant to First Embodiment and Second Embodiment

Hereinafter, a part of modification examples of the embodiments described above will be described. Not only the following modification examples but also a design change within a range not departing from the gist of the present invention can be suitably performed.

For example, in the first embodiment to the third embodiment described above, an example has been described in which the present form of the word is used as the basic form of the word registered in the bit filters 121, 221, and 321, but the basic form of the word is not limited to the present form of the word, any one type of the inflective forms of the word may be used. However, the present form of the word is used as the basic form of the word, and thus, it is possible to easily search a synonym such as various inflective forms of the word.

In addition, the encoding processing target may be a monitoring message or the like, which is output from the system, in addition to the data in the file. For example, processing is performed in which the monitoring message sequentially stored in the buffer is compressed by the encoding processing described above, and is stored as a log file. In addition, for example, the compression may be performed in page unit in a database, and the compression may be performed in unit where a plurality of pages are compiled.

In addition, information including a processing procedure, a control procedure, a specific name, and various data items or parameters described in the first embodiment, can be arbitrarily changed, unless otherwise noted.

Hardware Configuration of Information Processing Device

Figure 15:
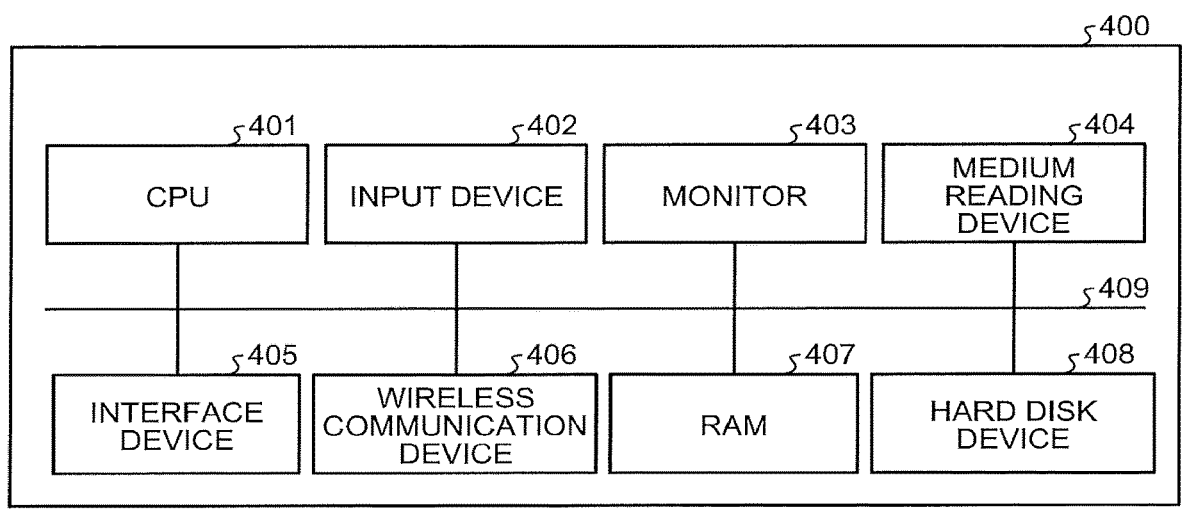
FIG. 15 is a diagram illustrating a hardware configuration of the information processing device of the first embodiment to the third embodiment.

FIG. 15 is a diagram illustrating hardware configurations of the information processing devices 100, 200, and 300 of the first embodiment to the third embodiment. As illustrated in the example of FIG. 15, a computer 400 includes a CPU 401 executing various operation processing, an input device 402 receiving data input from a user, and a monitor 403. In addition, the computer 400 includes a medium reading device 404 reading a program or the like from a storage medium, an interface device 405 for being connected to the other device, and a wireless communication device 406 for being connected to the other device in a wireless manner. In addition, the computer 400 includes a RAM 407 temporarily storing various information items, and a hard disk device 408. In addition, each of the devices 401 to 408 are connected to a bus 409.

For example, an information processing program having the same function as that of each processor of the file reading unit 111, the determining unit 112, the dynamic code applying unit 113, and the file writing unit 114, illustrated in FIG. 3, is stored in the hard disk device 408. In addition, various data items for realizing the information processing program are stored in the hard disk device 408.

The CPU 401 performs various processing by reading out each of the program stored in the hard disk device 408, by decompressing the program in the RAM 407, and by executing the program. The program is capable of allowing the computer 400, for example, to function as the file reading unit 111, the determining unit 112, the dynamic code applying unit 113, and the file writing unit 114, illustrated in FIG. 3.

Furthermore, it is not needed to store the information processing program described above in the hard disk device 408. For example, the program stored in the storage medium which can be read by the computer 400, may be read out and executed by the computer 400. The storage medium which can be read by the computer 400, for example, corresponds to a transportable recording medium such as a CD-ROM or a DVD disk, and a universal serial bus (USB) memory, a semiconductor memory such as a flash memory, a hard disk drive, or the like. In addition, the program may be stored in a device connected to a public line, the Internet, a local area network (LAN), or the like, and the computer 400 may read out and execute the program.

Figure 16:
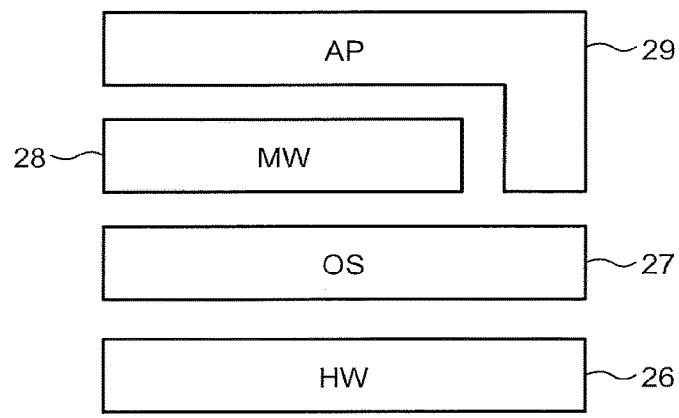
FIG. 16 is a diagram illustrating a configuration example of a program operated by a computer.

FIG. 16 is a diagram illustrating a configuration example of the program operated by the computer 400. In the computer 400, an operating system (OS) 27 controlling a hardware group 26 (401 to 409) illustrated in FIG. 15 is operated. The CPU 401 is operated in a procedure according to the OS 27, and controls and manages the hardware group 26, and thus, executes processing according to an application program 29 or middleware 28 in the hardware group 26. Further, in the computer 400, the middleware 28 or the application program 29 is read out to the RAM 407, and is executed by the CPU 401.

In a case where a compressing function is called by the CPU 401, processing based on at least a part of the middleware 28 and the application program 29 is performed (by controlling the hardware group 26 on the basis of the OS 27), the function of the compressing unit 110 is realized. Each compressing function may be included in the application program 29 itself, or may be a part of the middleware 28 which is executed by being called according to the application program 29.

The compressed file 11 obtained by the compressing function of the application program 29 (or the middleware 28) can also be partially extended. In a case where the extension is performed in the middle of the compressed file 11, extending processing with respect to compressed data to a portion of an extension target is suppressed, and thus, a load of the CPU 401 is suppressed. In addition, the compressed data of the extension target is partially decompressed on the RAM 407, and thus, the working area is also reduced.

Figure 17:
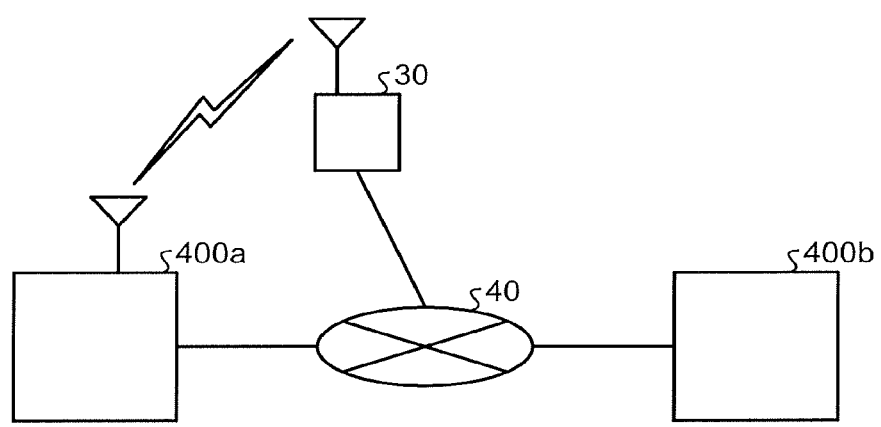
FIG. 17 is a diagram illustrating a configuration example of a device in a system of an embodiment.

FIG. 17 is a diagram illustrating a configuration example of a device of a system of an embodiment. The system of FIG. 17 includes a computer 400a, a computer 400b, a base station 30, and a network 40. The computer 400a is connected to the network 40, which is connected to the computer 400b, in at least one of a wireless manner and a wired manner.

According to the embodiments, it is possible to improve a compression ratio in a case of performing encoding by assigning an individual code to a word having a high appearance frequency.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An encoding method, comprising:
    determining, by a processor, whether or not encoding target data is in an inflective form of a word based on whether the encoding target data included in target sentence data is registered in a static dictionary in which the word and a basic code are stored in association with each other, the basic code being a compressed code of the word; and
    in a case that the determining indicates that the encoding target data is in the inflective form of the word:
        assigning, by the processor, a dynamic code to the encoding target data, the dynamic code being a compressed code of the encoding target data; and
        registering, by the processor, the basic code and the dynamic code assigned to the encoding target data in a dynamic dictionary in association with each other.

2. The encoding method according to claim 1, wherein the method further comprising:
    determining a basic form and the change type of the word;
    determining whether or not a dynamic code corresponding to the inflective form of the word is registered in a bit filter; and
    when the dynamic code is registered in the dynamic dictionary and in the bit filter, acquiring the dynamic code corresponding to the inflective form of the word from the bit filter and writing the dynamic code acquired in a compressed file.

3. The encoding method according to claim 2, wherein the method further comprising:

when the dynamic code is not registered in the bit filter, acquiring the dynamic code from the dynamic dictionary, and registering the dynamic code acquired from the dynamic dictionary and the basic form of the word in the bit filter in association with each other.

4. An encoding device, comprising:

a processor configured to:

determine whether or not encoding target data is in an inflective form of a word based on whether the encoding target data included in target sentence data is registered in a static dictionary in which the word and a basic code are stored in association with each other, the basic code being a compressed code of the word; and in a case that the processor determines that the encoding target data is in the inflective form of the word:

assign a dynamic code to the encoding target data, the dynamic code being a compressed code of the encoding target data; and register the basic code and the dynamic code assigned to the encoding target data in a dynamic dictionary in association with each other.

\* \* \* \* \*